(12) United States Patent
Tabakoya et al.

(10) Patent No.: US 12,628,665 B2
(45) Date of Patent: May 12, 2026

(54) SEMICONDUCTOR DEVICE

(71) Applicants:Kabushiki Kaisha Toshiba, Tokyo
(JP); **Toshiba Electronic Devices &
Storage Corporation**, Tokyo (JP)

(72) Inventors: Taira Tabakoya, Fuchu Tokyo (JP);
Toshihiro Tsujimura, Ota Tokyo (JP)

(73) Assignees: Kabushiki Kaisha Toshiba, Kawasaki
(JP); **Toshiba Electronic Devices &
Storage Corporation**, Kawasaki (JP)

( * ) Notice: Subject to any disclaimer, the term of this
patent is extended or adjusted under 35
U.S.C. 154(b) by 460 days.

(21) Appl. No.: 18/176,369

(22) Filed: Feb. 28, 2023

(65) Prior Publication Data

US 2024/0105562 A1     Mar. 28, 2024

(30) Foreign Application Priority Data

Sep. 22, 2022     (JP) ................................. 2022-151661

(51) Int. Cl.
H10W 70/40 (2026.01)
H10W 72/00 (2026.01)
(Continued)

(52) U.S. Cl.
CPC ....... H10W 70/461 (2026.01); H10W 70/417
(2026.01); H10W 70/466 (2026.01);
(Continued)

(58) Field of Classification Search
None
See application file for complete search history.

(56) References Cited

U.S. PATENT DOCUMENTS 10,217,689 B2     2/2019 Yasutake
11,367,715 B2     6/2022 Tonedachi
(Continued)

FOREIGN PATENT DOCUMENTS

JP     2008-306115 A     12/2008
JP     2017-010440     1/2017
(Continued)

OTHER PUBLICATIONS

Office Action issued in Japanese Patent Application No. 2022-151661 dated Aug. 26, 2025, in 8 pages.

*Primary Examiner* — Sue A Purvis
*Assistant Examiner* — Jordan M Klein
(74) *Attorney, Agent, or Firm* — Knobbe, Martens, Olson & Bear, LLP

(57) ABSTRACT

A semiconductor device can include: a semiconductor chip including a first and second surface, a first electrode on the first surface, an active area on the second surface, a second electrode on the second surface, and a third electrode on the second surface; a first conductive member in the active area of the semiconductor chip and electrically connected to the semiconductor chip; a second conductive member in a second area and isolated from the first conductive member, the second area an area in which, when viewed from above, with respect to a first area of the active area in which the first conductive member is not provided, circles sharing centers of shortest distances between an outer periphery of the first conductive member and an outer periphery of the active area can be drawn largest in the first area; and a lead terminal connected to the first conductive member.

6 Claims, 12 Drawing Sheets

(51) Int. Cl.
   *H10W 72/30*     (2026.01)
   *H10W 90/00*     (2026.01)
(52) U.S. Cl.
   CPC .... *H10W 70/481* (2026.01); *H10W 72/07353*
     (2026.01); *H10W 72/334* (2026.01); *H10W*
              *90/736* (2026.01)

(56)       References Cited

U.S. PATENT DOCUMENTS

| | | | |
|---|---|---|---|
| 2007/0290336 A1* | 12/2007 | Sun | H01L 24/37 |
| | | | 257/E23.044 |
| 2011/0241198 A1* | 10/2011 | Azuma | H01L 24/37 |
| | | | 257/696 |
| 2015/0214139 A1* | 7/2015 | Miyakawa | H01L 23/492 |
| | | | 257/675 |
| 2017/0179108 A1 | 6/2017 | Okuda et al. | |
| 2020/0402946 A1 | 12/2020 | Takada | |
| 2021/0280532 A1* | 9/2021 | Suzuki | H01L 23/49562 |
| 2021/0294952 A1 | 9/2021 | Imi et al. | |

FOREIGN PATENT DOCUMENTS

| | | |
|---|---|---|
| JP | 2017-130540 | 7/2017 |
| JP | 2017-147433 A | 8/2017 |
| JP | 2020-205380 A | 12/2020 |
| JP | 2021-089971 | 6/2021 |
| JP | 2021-149855 | 9/2021 |
| JP | 2021-152698 | 9/2021 |
| JP | 2022-033586 | 3/2022 |

* cited by examiner

SEMICONDUCTOR DEVICE

CROSS-REFERENCE TO RELATED APPLICATION(S)

This application is based upon and claims the benefit of priority from Japanese Patent Application No. 2022-151661, filed Sep. 22, 2022, the entire contents of which are incorporated herein by reference.

FIELD

Embodiments described herein relate generally to a semiconductor device.

BACKGROUND

A semiconductor device including a semiconductor chip such as a metal oxide semiconductor field effect transistor (MOSFET) is used for power conversion or the like. For example, when the above semiconductor device is a vertical MOSFET, a source electrode and a gate electrode provided on an upper surface of the semiconductor chip are respectively connected to connectors provided above the semiconductor chip.

Examples of related art include JP-A-2019-197842.

DESCRIPTION OF THE DRAWINGS

FIG. 5 is a schematic view of a semiconductor device according to another aspect of the first embodiment.

FIG. 10 is a schematic view of a semiconductor device according to a second embodiment.

FIG. 11 is a schematic view of a semiconductor device according to a third embodiment.

FIG. 12 is a schematic view of a semiconductor device according to a fourth embodiment.

DETAILED DESCRIPTION

Figure 1A:
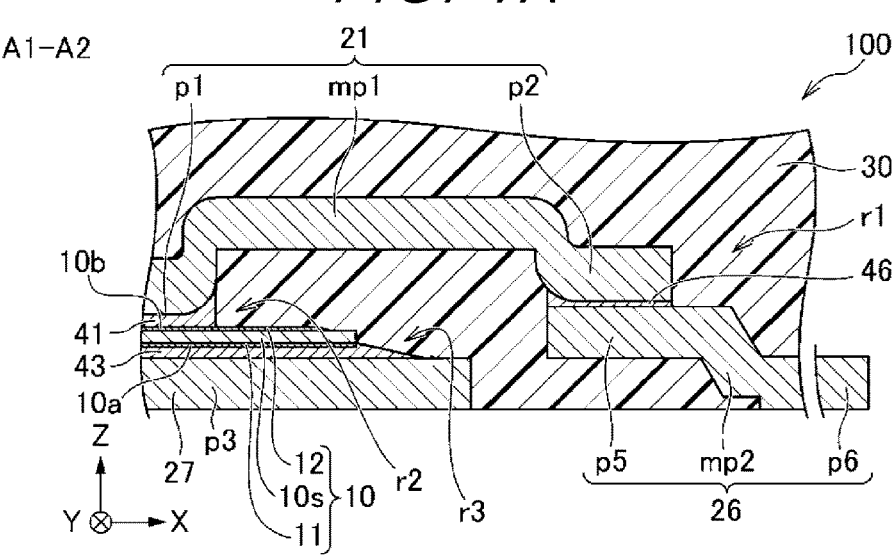
FIGS. 1A, 1B and 1C are schematic views of a semiconductor device according to a first embodiment.

Embodiments provide a semiconductor device that has a wide safe operation area and that has high reliability.

In general, according to one embodiment, a semiconductor device according to an embodiment includes: a semiconductor chip including a first surface, a second surface, a first electrode provided on the first surface, an active area provided on the second surface, a second electrode provided on the second surface, and a third electrode provided on the second surface; a first conductive member provided in the active area of the semiconductor chip and electrically connected to the semiconductor chip; a second conductive member provided in a second area in a manner of being isolated from the first conductive member, the second area being an area in which, when viewed from above, with respect to a first area of the active area in which the first conductive member is not provided, circles sharing centers of shortest distances between an outer periphery of the first conductive member and an outer periphery of the active area can be drawn largest in the first area; and a lead terminal connected to the first conductive member.

Hereinafter, the embodiments will be described with reference to the drawings. In the following description, the same members or the like are denoted by the same reference numerals, and description of members or the like once described may be omitted as appropriate.

In the present description, in order to indicate a positional relationship between components and the like, an upward direction in the drawings is described as "upper", and a downward direction in the drawings is described as "lower". In the present description, concepts of "upper" and "lower" are not necessarily terms indicating a relation with a direction of gravity.

First Embodiment

A semiconductor device according to the present embodiment includes: a semiconductor chip including a first surface, a second surface, a first electrode provided on the first surface, an active area provided on the second surface, a second electrode provided on the second surface, and a third electrode provided on the second surface; a first conductive member provided in the active area of the semiconductor chip and electrically connected to the semiconductor chip; a second conductive member provided in a second area in a manner of being isolated from the first conductive member, the second area being an area in which, when viewed from above, with respect to a first area of the active area in which the first conductive member is not provided, circles sharing centers of shortest distances between an outer periphery of the first conductive member and an outer periphery of the active area can be drawn largest in the first area; and a lead terminal connected to the first conductive member.

Further, the semiconductor device according to the present embodiment includes: a semiconductor chip including a first surface, a second surface, a first electrode provided on the first surface, an active area provided on the second surface, a second electrode provided on the second surface, and a third electrode provided on the second surface; a first conductive member provided in the active area of the semiconductor chip and electrically connected to the semiconductor chip; a second conductive member provided in the active area in a manner of being isolated from the first conductive member when viewed from above; and a lead terminal electrically connected to the first conductive member, wherein a first portion of the first conductive member, which is provided on the semiconductor chip, has a rectangular shape including a first side, a second side, a third side and a fourth side, in an area where the first conductive member is not provided, the active area includes a first outer peripheral area adjacent to the first side and an outer periphery of the active area, a second outer peripheral area adjacent to the second side and the outer periphery of the active area, a third outer peripheral area adjacent to the third side and the outer periphery of the active area, and a fourth outer peripheral area adjacent to the fourth side and the outer periphery of the active area, a distance from the fourth side to the outer periphery of the active area in the fourth outer peripheral area is longer than any one of a distance from the first side to the outer periphery of the active area in the first outer peripheral area, a distance from the second side to the outer periphery of the active area in the second outer peripheral area, and a distance from the third side to the outer periphery of the active area in the third outer peripheral area, and the second conductive member is provided in the fourth outer peripheral area.

Figure 1B:
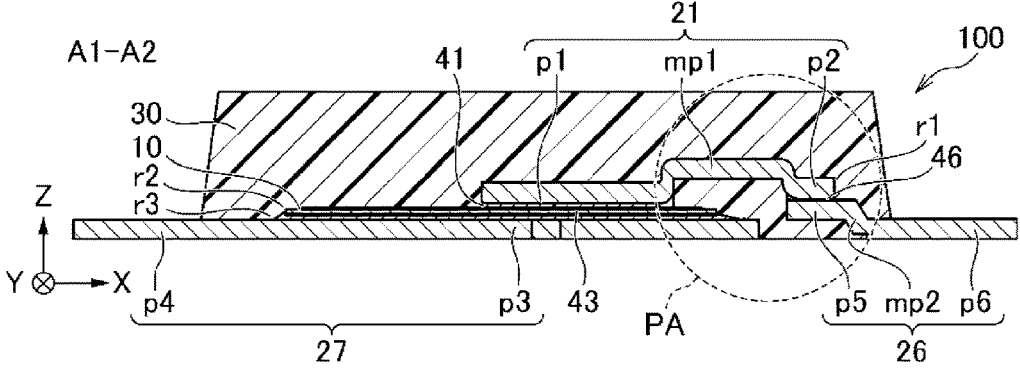
Figure 1C:
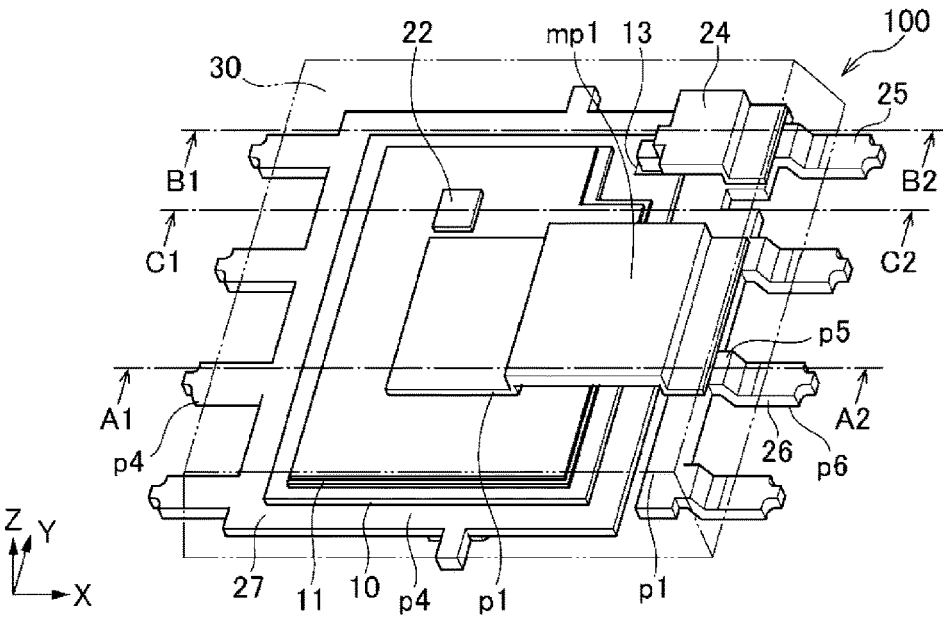
Figure 2:
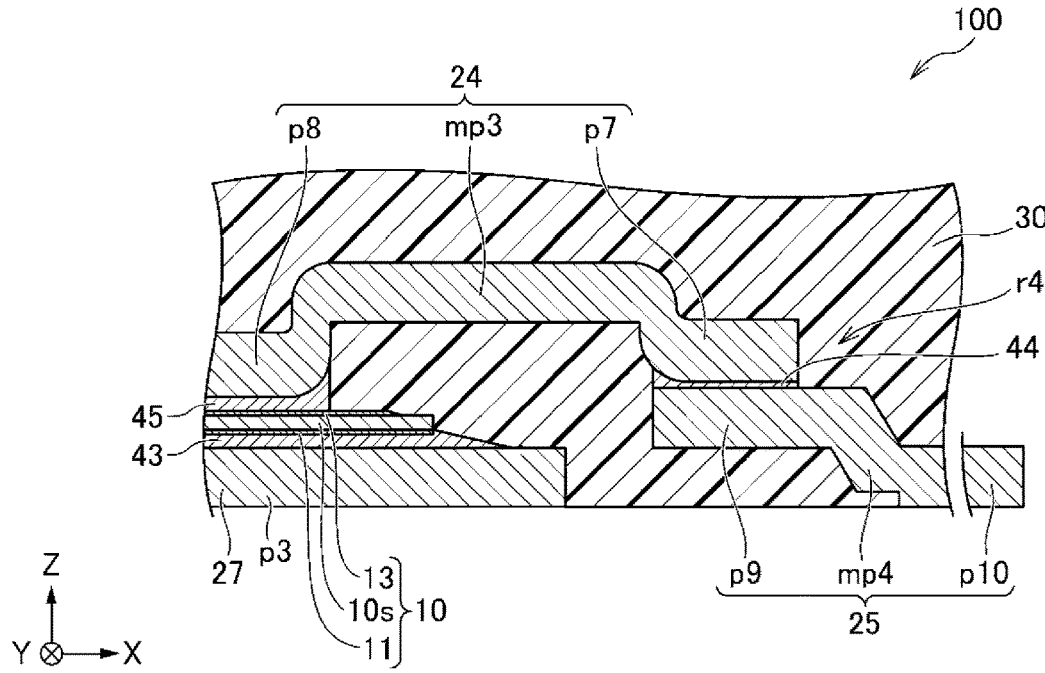
FIG. 2 is a schematic view of the semiconductor device according to the first embodiment.

FIGS. 1A to 2 are schematic views of a semiconductor device 100 according to the present embodiment. FIG. 1C is a schematic perspective view of the semiconductor device 100 according to the present embodiment. FIG. 1B is a schematic cross-sectional view taken along a line A1-A2 in FIG. 1C. FIG. 1A is an enlarged view of the schematic cross-sectional view taken along the line A1-A2 in FIG. 1C. FIG. 2 is an enlarged view of the schematic cross-sectional view taken along a line B1-B2 in FIG. 1C.

The semiconductor device 100 includes a semiconductor chip 10, a first conductive member 21, a second conductive member 22, a third conductive member 23, a fourth conductive member 24, a fifth conductive member 25, a sixth conductive member 26, a seventh conductive member 27, a first connection member 41, a second connection member 42, a third connection member 43, a fourth connection member 44, a fifth connection member 45, a sixth connection member 46, a resin 30 and an insulating film 70.

In the following drawings, illustration of the insulating film 70 may be omitted.

The semiconductor chip 10 is a chip obtained by providing a vertical MOSFET, an insulated gate bipolar transistor (IGBT), or the like on a semiconductor substrate made of, for example, silicon (Si), silicon carbide (SiC), gallium arsenide (GaAs), or gallium nitride (GaN). The semiconductor chip 10 includes a first electrode 11 (for example, a drain electrode), a second electrode 12 (for example, a source electrode), and a semiconductor layer 10s. In this example, the semiconductor layer 10s is provided between the first electrode 11 and the second electrode 12. The semiconductor chip 10 further includes a third electrode 13 (for example, a gate electrode). For example, the semiconductor chip 10 includes a first surface (for example, a lower surface) 10a and a second surface (for example, an upper surface) 10b opposite to the first surface 10a. The first electrode 11 is provided on the first surface 10a. The second electrode 12 and the third electrode 13 are provided on the second surface 10b.

As illustrated in FIGS. 1A and 1B, the first conductive member 21 includes a first portion p1 and a second portion p2. In this example, the first conductive member 21 further includes a first intermediate portion mp1.

The first portion p1 is electrically connected to the semiconductor chip 10. In this example, the first portion p1 is electrically connected to the second electrode 12 (for example, the source electrode). The first portion p1 is in contact with the first connection member 41 (see FIG. 1A).

Here, an X direction (an X-axis direction), a Y direction (a Y-axis direction) perpendicularly intersecting the X direction, and a Z direction (a Z-axis direction) perpendicularly intersecting the X direction and the Y direction are defined.

A direction from the semiconductor chip 10 toward the first portion p1 is along a first direction (the Z-axis direction). For example, the first portion p1 is positioned above the semiconductor chip 10.

A direction from the first portion p1 toward the second portion p2 is along a second direction. The second direction intersects the first direction (the Z-axis direction). In this example, the second direction is the X-axis direction. For example, at least a portion of the first conductive member 21 extends along the X-axis direction.

The first intermediate portion mp1 is positioned between the first portion p1 and the second portion p2 in the second direction (the X-axis direction). In this example, the first intermediate portion mp1 is positioned higher than the first portion p1 and the second portion p2. The first portion p1 and the second portion p2 are provided between the semiconductor chip 10 and the first intermediate portion mp1 in the first direction (the Z-axis direction).

The sixth conductive member 26 includes a fifth portion p5 and a sixth portion p6. A direction from the fifth portion p5 toward the sixth portion p6 is along a third direction. The third direction intersects the first direction (the Z-axis direction). In this example, the third direction is the X-axis direction, and is along the second direction.

As illustrated in FIG. 1A, the sixth connection member 46 is provided between the second portion p2 and the fifth portion p5. The sixth connection member 46 is conductive. The sixth connection member 46 includes, for example, a solder.

The second electrode 12 (for example, the source electrode) of the semiconductor chip 10 is electrically connected to the sixth conductive member 26 via the first conductive member 21 and the sixth connection member 46. The sixth portion p6 of the sixth conductive member 26 serves as an external terminal (a lead terminal) connected to the outside.

Thus, the first conductive member 21 electrically connects the semiconductor chip 10 and the sixth conductive member 26 (the external terminal, the lead terminal). The first conductive member 21 is, for example, a connector (a source connector). Meanwhile, the fifth portion p5 of the sixth conductive member 26 functions as a post.

The resin 30 covers, for example, these members. The resin 30 is, for example, a sealing resin.

As illustrated in FIGS. 1B and 1C, the resin 30 does not cover the sixth portion p6 of the sixth conductive member 26. The sixth portion p6 is exposed from the resin 30. As a result, the sixth portion p6 can be electrically connected to the outside.

In the one hand, as illustrated in FIG. 1B, the resin 30 is provided above the first conductive member 21. For example, the first portion p1 is positioned between a part of the resin 30 and the semiconductor chip 10 in the Z-axis direction.

As illustrated in FIGS. 1A and 1B, the first connection member 41 is positioned between the semiconductor chip 10 and the first portion p1. The first connection member 41 is conductive. The first connection member 41 includes, for example, a solder. The first connection member 41 electrically connects the second electrode 12 of the semiconductor chip 10 and the first portion p1. The first portion p1 is in contact with the first connection member 41.

As illustrated in FIG. 1A, the sixth conductive member 26 further includes a second intermediate portion mp2 in addition to the fifth portion p5 and the sixth portion p6. In the third direction (in this example, along the second direction, for example, the X-axis direction), the second intermediate portion mp2 is positioned between the fifth portion p5 and the sixth portion p6. In this example, the fifth portion p5 is positioned higher than the sixth portion p6. For example, a position of the second intermediate portion mp2 in the first direction (the Z-axis direction) is between a position of the sixth connection member 46 in the first direction and a position of the sixth portion p6 in the first direction, and between a position of the fifth portion p5 in the first direction and the position of the sixth portion p6 in the first direction. For example, the fifth portion p5 is positioned between a part of the resin 30 and the sixth connection member 46 in the Z-axis direction.

As illustrated in FIG. 1B, the seventh conductive member 27 includes a third portion p3 and a fourth portion p4. In the first direction (the Z-axis direction), the third portion p3 overlaps the semiconductor chip 10. A direction from the third portion p3 toward the semiconductor chip 10 is along the first direction (the Z-axis direction).

The seventh conductive member 27 is, for example, a bed. The seventh conductive member 27 may function as a heat dissipation path for heat generated by the semiconductor chip 10.

At least a part of the fourth portion p4 of the seventh conductive member 27 is not covered with the resin 30. At least a part of the fourth portion p4 is exposed from the resin 30. The fourth portion p4 serves as another external terminal connected to the outside.

As illustrated in FIG. 1A, the third connection member 43 is provided between the third portion p3 and the semiconductor chip 10. In this example, the third connection member 43 is provided between the third portion p3 and the first electrode 11 (for example, the drain electrode). The third connection member 43 is conductive. The third connection member 43 includes, for example, a solder. The third connection member 43 electrically connects the third portion p3 and the second electrode 12 of the semiconductor chip 10.

Thus, the first conductive member 21 is electrically connected to the second electrode 12. The sixth conductive member 26 is electrically connected to the second electrode 12 via the first conductive member 21. The seventh conductive member 27 is electrically connected to the first electrode 11.

As illustrated in FIG. 2, the fourth conductive member 24 includes a seventh portion p7 and an eighth portion p8. In this example, the fourth conductive member 24 further includes a third intermediate portion mp3.

The eighth portion p8 is electrically connected to the semiconductor chip 10. In this example, the eighth portion p8 is electrically connected to the third electrode 13 (for example, the gate electrode) (see FIG. 2).

A direction from the semiconductor chip 10 toward the eighth portion p8 is along the first direction (the Z-axis direction). For example, the eighth portion p8 is positioned above the semiconductor chip 10.

The direction from the eighth portion p8 toward the seventh portion p7 is along a fourth direction. The fourth direction intersects the first direction (the Z-axis direction). In this example, the fourth direction is the X-axis direction. For example, at least a portion of the fourth conductive member 24 extends along the X-axis direction.

The third intermediate portion mp3 is positioned between the eighth portion p8 and the seventh portion p7 in the fourth direction (the X-axis direction). A position of the third intermediate portion mp3 in the fourth direction is between a position of the eighth portion p8 in the fourth direction and a position of the seventh portion p7 in the fourth direction. In this example, the third intermediate portion mp3 is positioned higher than the eighth portion p8 and the seventh portion p7. The seventh portion p7 and the eighth portion p8 are provided between the semiconductor chip 10 and the third intermediate portion mp3 in the first direction (the Z-axis direction).

The fifth conductive member 25 includes a ninth portion p9 and a tenth portion p10. A direction from the ninth portion p9 toward the tenth portion p10 is along a fifth direction. The fifth direction intersects the first direction (the Z-axis direction). In this example, the fifth direction is the X-axis direction.

As illustrated in FIG. 2, the fifth conductive member 25 further includes a fourth intermediate portion mp4 in addition to the ninth portion p9 and the tenth portion p10. In the fifth direction (along the second direction in this example, for example, the X-axis direction), the fourth intermediate portion mp4 is positioned between the ninth portion p9 and the tenth portion p10. In this example, the ninth portion p9 is positioned higher than the tenth portion p10. For example, a position of the fourth intermediate portion mp4 in the first direction (the Z-axis direction) is between a position of the fourth connection member 44 in the first direction and a position of the tenth portion p10 in the first direction, and between a position of the ninth portion p9 in the first direction and the position of the tenth portion p10 in the first direction. For example, the ninth portion p9 is positioned between a part of the resin 30 and the fourth connection member 44 in the Z-axis direction.

As illustrated in FIG. 2, the fifth connection member 45 is positioned between the semiconductor chip 10 and the eighth portion p8. The fifth connection member 45 is conductive. The fifth connection member 45 includes, for example, a solder. The fifth connection member 45 electrically connects the third electrode 13 of the semiconductor chip 10 and the eighth portion p8.

As illustrated in FIG. 2, the fourth connection member 44 is provided between the seventh portion p7 and the ninth portion p9. The fourth connection member 44 electrically connects the seventh portion p7 and the ninth portion p9. The fourth connection member 44 is conductive. The fourth connection member 44 includes, for example, a solder.

The third electrode 13 (for example, the gate electrode) of the semiconductor chip 10 is electrically connected to the fifth conductive member 25 via the fourth conductive member 24 and the fourth connection member 44. The tenth portion p10 of the fifth conductive member 25 serves as an external terminal (a lead terminal) connected to the outside.

Thus, the fourth conductive member 24 electrically connects the semiconductor chip 10 and the fifth conductive member 25. The fourth conductive member 24 is, for example, a connector (a gate connector). Meanwhile, the tenth portion p10 of the fifth conductive member 25 functions as a post.

As illustrated in FIG. 2, the tenth portion p10 of the fifth conductive member 25 is not covered with the resin 30. The tenth portion p10 is exposed from the resin 30. As a result, the tenth portion p10 can be electrically connected to the outside.

As illustrated in FIG. 1C, the semiconductor device 100 includes the second conductive member 22. The second conductive member 22 is provided above the second surface 10b. The second conductive member 22 is, for example, a metal block containing Cu. The second conductive member 22 has, for example, a rectangular parallelepiped shape.

Figure 3:
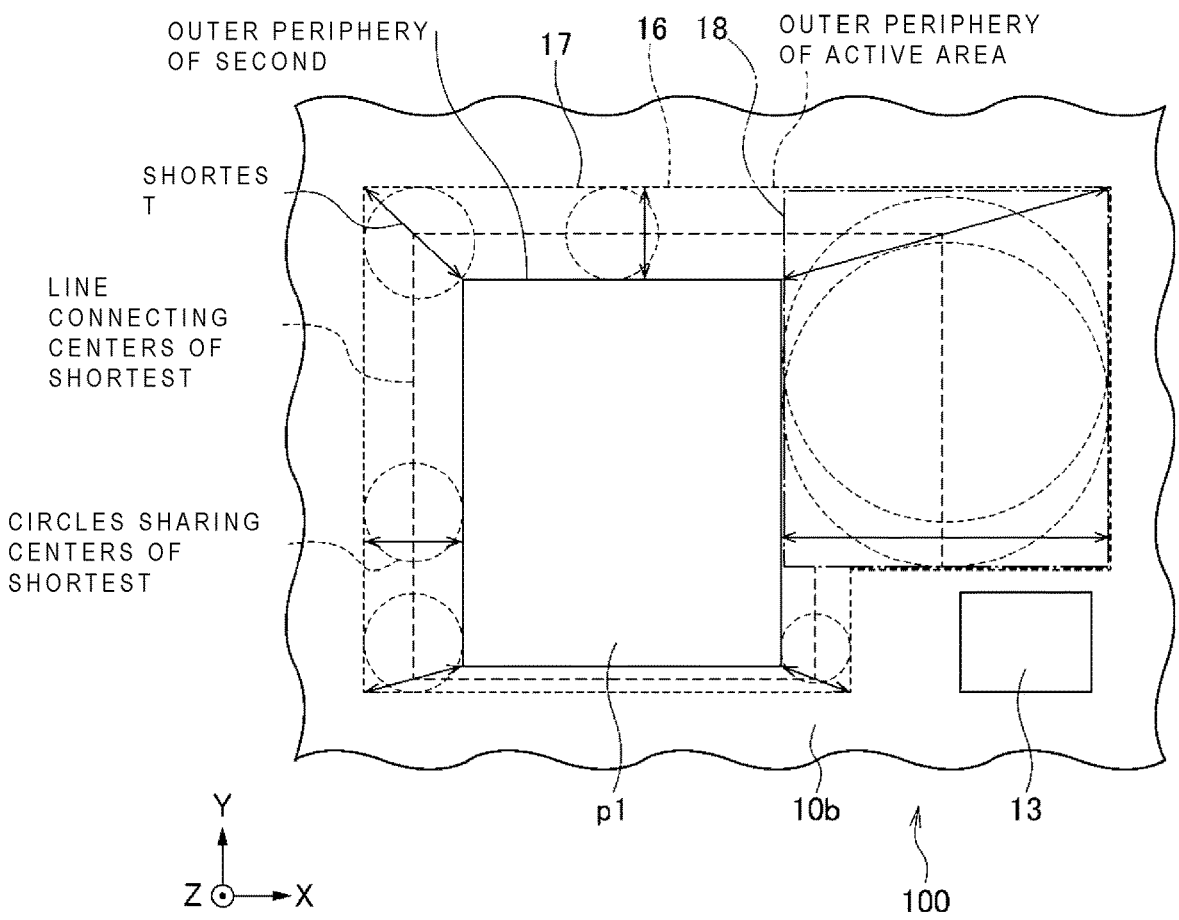
FIG. 3 is a schematic view illustrating an upper surface of the semiconductor chip according to the first embodiment.

FIG. 3 is a schematic view illustrating the second surface (the upper surface) 10b of the semiconductor chip 10 according to the first embodiment.

As illustrated in FIG. 3, an active area 16 is provided on the second surface 10b. The first portion p1 of the first conductive member 21 is electrically connected to the active area 16 via the first connection member 41 and the second electrode 12. The third electrode 13 is provided above the second surface 10b. A first area 17 is an area in the active area 16 where the first portion p1 of the first conductive member 21 and the third electrode 13 are not provided.

With respect to the first area 17, an area where circles sharing centers of shortest distances between an outer periphery of the first portion p1 of the first conductive member 21 and an outer periphery of the active area 16 can be drawn largest in the first area 17 is referred to as a second area 18. FIG. 3 illustrates arrows indicating the shortest distances between the outer periphery of the first portion p1 of the first conductive member 21 and the outer periphery of the active area 16, a line connecting the centers of the shortest distances between the outer periphery of the first portion p1 of the first conductive member 21 and the center of the outer periphery of the active area 16, and the circles sharing the centers of the shortest distances between the outer periphery of the first portion p1 of the first conductive member 21 and the outer periphery of the active area 16.

The second area 18 is an area where the circles sharing the centers of the shortest distances between the outer periphery of the first portion p1 of the first conductive member 21 and the outer periphery of the active area 16 can be drawn largest. In the second area 18, the second conductive member 22 is provided in a manner of being isolated from the first conductive member 21. In other words, in the second area 18, the second conductive member 22 is provided in a manner of being separated from the first conductive member 21. In this case, the second conductive member 22 is not connected to the first conductive member 21 or a connector other than the first conductive member 21.

Figure 4A:
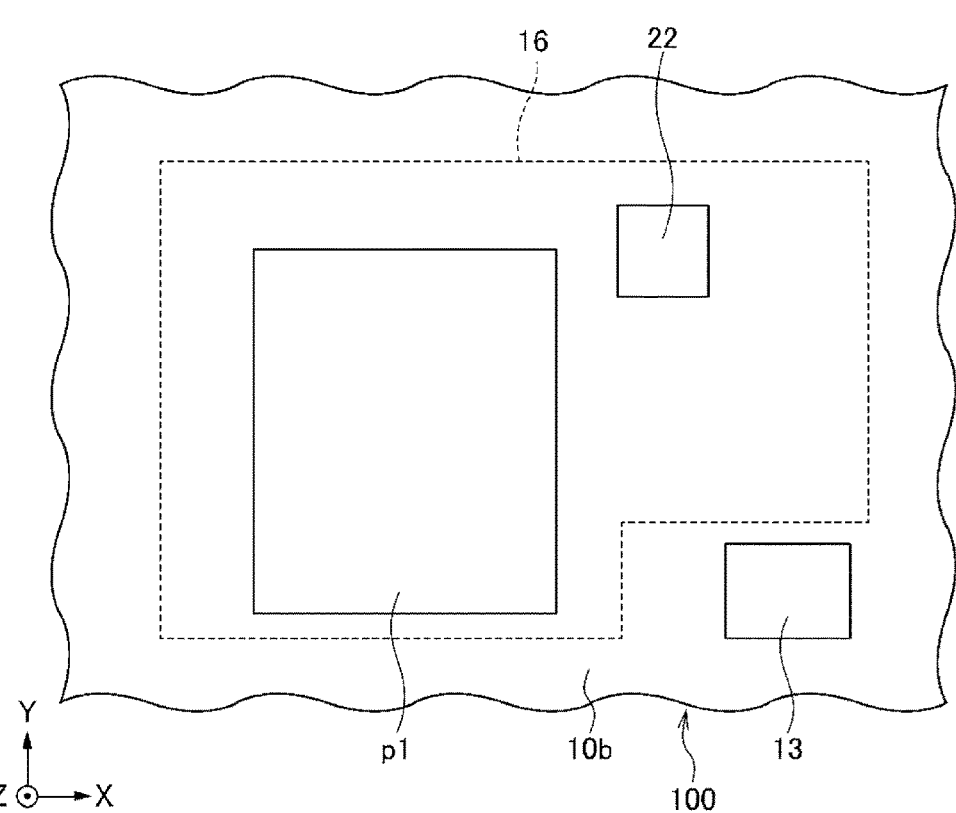
FIGS. 4A and 4B are schematic views of the semiconductor device according to the first embodiment.
Figure 4B:
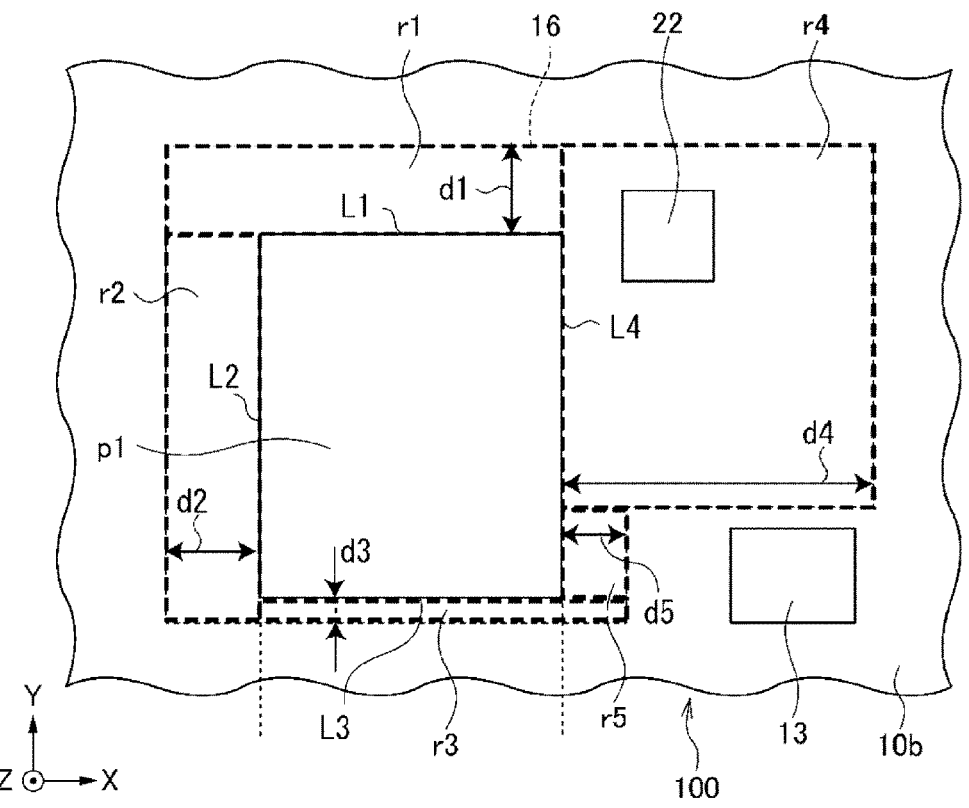

FIGS. 4A and 4B are schematic views of the semiconductor device 100 according to the present embodiment. FIGS. 4A and 4B are schematic views illustrating the placement of the active area 16, the first portion p1 of the first conductive member 21, the third electrode 13, and the second conductive member 22 when the second surface 10b of the semiconductor device 100 according to the present embodiment is viewed from above. As illustrated in FIGS. 1, 4A and 4B, the second conductive member 22 has, for example, a rectangular parallelepiped shape.

As illustrated in FIG. 4B, the first portion p1 of the first conductive member 21 includes a first side L1, a second side L2, a third side L3, and a fourth side L4 in a part connected to the first connection member 41. In FIG. 4B, the first side L1 and the third side L3 face each other, and both extend in the X direction. Further, in FIG. 4B, the second side L2 and the fourth side L4 face each other, and both extend in the Y direction. In addition, in the active area 16 where the first portion p1 of the first conductive member 21 is not provided, a first outer peripheral area r1 adjacent to the first side L1 and the outer periphery of the active area 16, a second outer peripheral area r2 adjacent to the second side L2 and the outer periphery of the active area 16, a third outer peripheral area r3 adjacent to the third side L3 and the outer periphery of the active area 16, a fourth outer peripheral area r4 adjacent to the fourth side L4 and the outer periphery of the active area 16, and a fifth outer peripheral area r5 adjacent to the fourth side L4 and the outer periphery of the active area 16 are provided. Here, the first outer peripheral area r1, the second outer peripheral area r2, the third outer peripheral area r3, the fourth outer peripheral area r4 and the fifth outer peripheral area r5 are areas each having a rectangular shape. A distance from the first side L1 to the outer periphery of the active area 16 in the first outer peripheral area r1 is d1. A distance from the second side L2 to the outer periphery of the active area 16 in the second outer peripheral area r2 is d2. A distance from the third side L3 to the outer periphery of the active area 16 in the third outer peripheral area r3 is d3.

A distance from the fourth side L4 to the outer periphery of the active area 16 in the fourth outer peripheral area r4 is d4. A distance from the fourth side L4 to the outer periphery of the active area 16 in the fifth outer peripheral area r5 is d5. The distance d4 is longer than any one of the distance d1, the distance d2, the distance d3 and the distance d5. The second conductive member 22 is provided in the fourth outer peripheral area r4.

Figure 5:
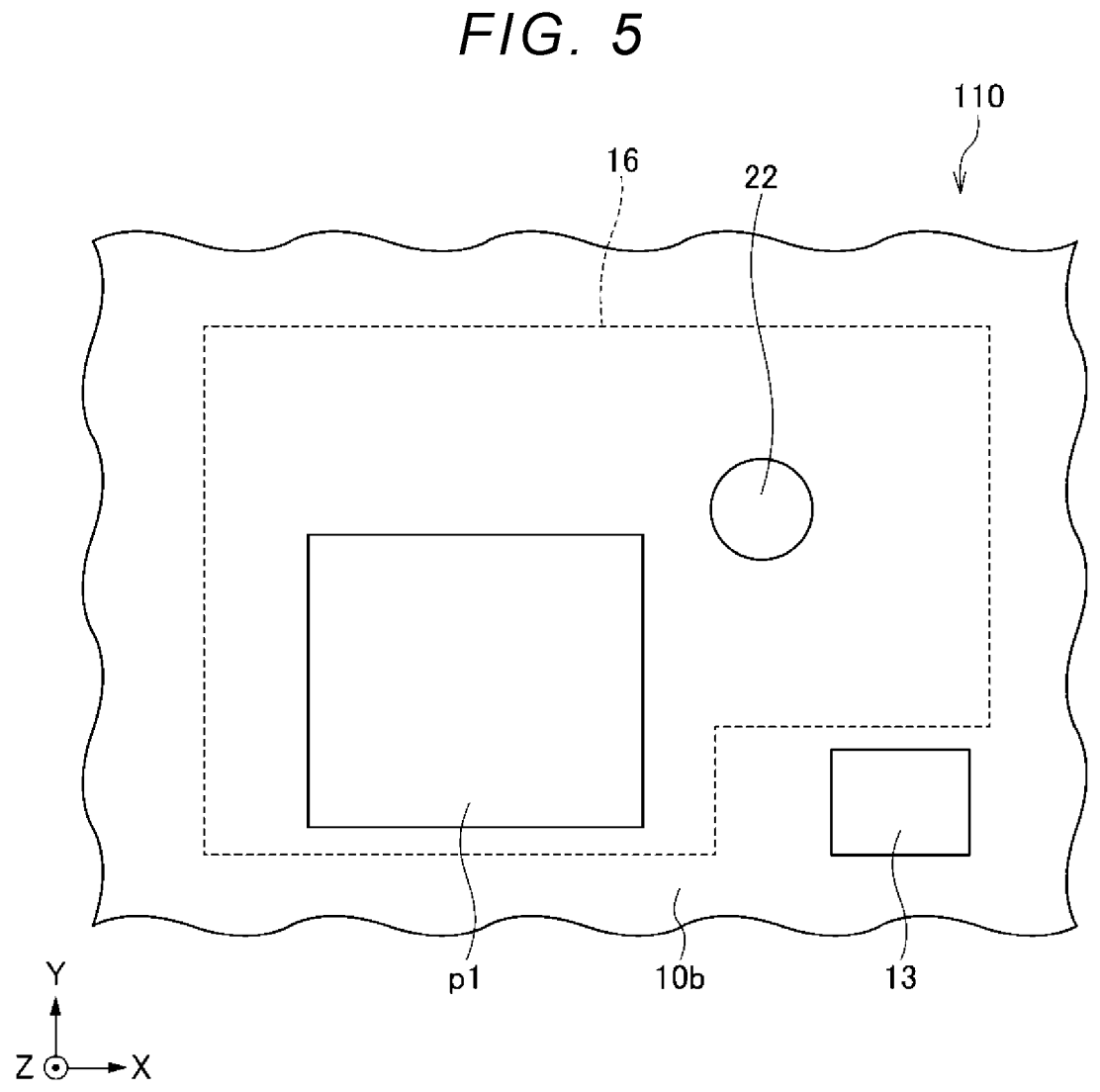

FIG. 5 is a schematic view of a semiconductor device 110 according to another aspect of the present embodiment. FIG. 5 is a schematic view illustrating the placement of the active area 16, the first portion p1 of the first conductive member 21, the third electrode 13, and the second conductive member 22 when the second surface 10b of the semiconductor device 110 according to the present embodiment is viewed from above. The shape of the second conductive member 22 is not limited to a rectangular parallelepiped shape. The shape of the second conductive member 22 is, for example, a cylindrical shape whose bottom surface is parallel to an XY plane.

Further, the shape of the second conductive member 22 is not limited to a rectangular parallelepiped shape or a cylindrical shape.

Figure 6:
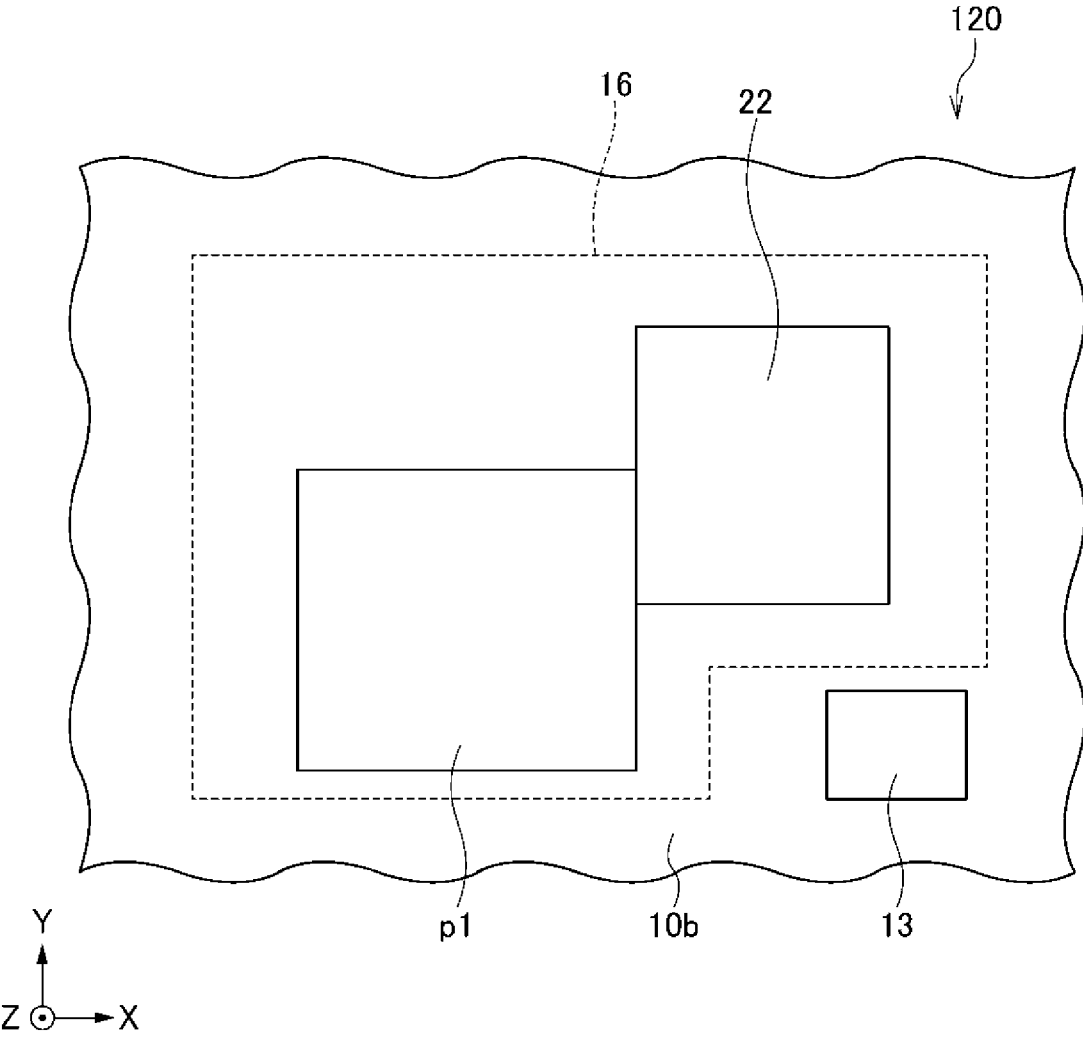
FIG. 6 is a schematic view of a semiconductor device according to another aspect of the first embodiment.

FIG. 6 is a schematic view of a semiconductor device 120 according to another aspect of the present embodiment. FIG. 6 is a schematic view illustrating the placement of the active area 16, the first portion p1 of the first conductive member 21, the third electrode 13, and the second conductive member 22 when the second surface 10b of the semiconductor device 120 according to the present embodiment is viewed from above. As illustrated in FIG. 6, the first portion p1 of the first conductive member 21 and the second conductive member 22 may be in direct contact with each other.

For example, a position where the second conductive member 22 is placed may be a location adjacent to a location where heat generation of the semiconductor chip 10 is particularly large. For example, the location where the heat generation of the semiconductor chip 10 is particularly large can be determined by thermal simulation.

Figure 7A:
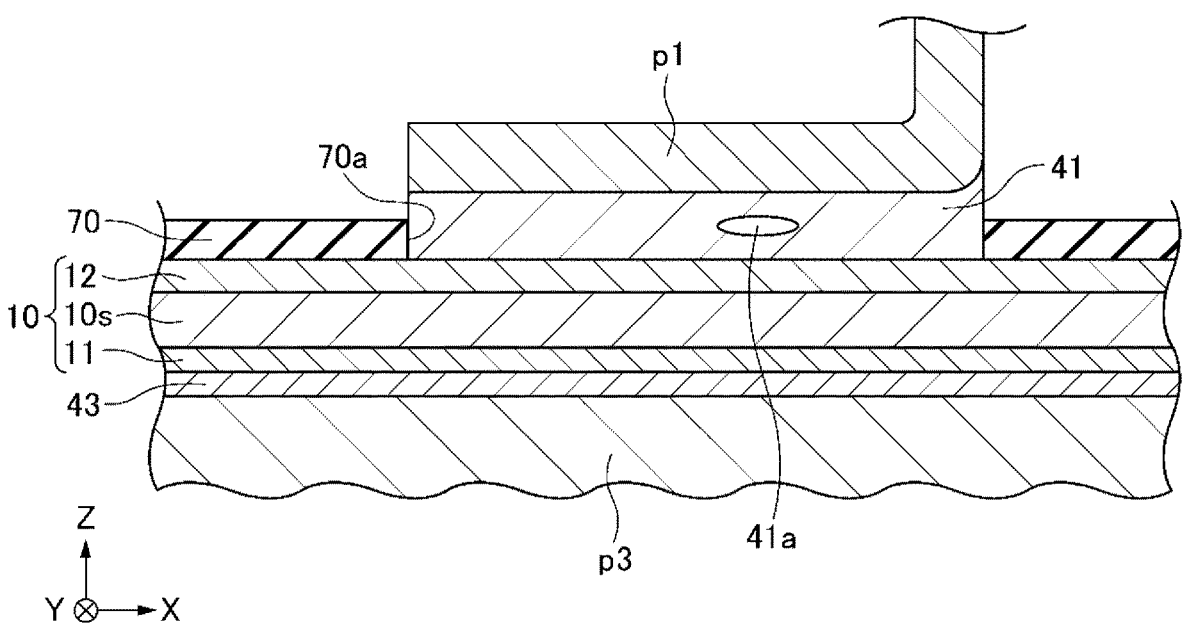
FIGS. 7A and 7B are schematic views of the semiconductor device according to the first embodiment.
Figure 7B:
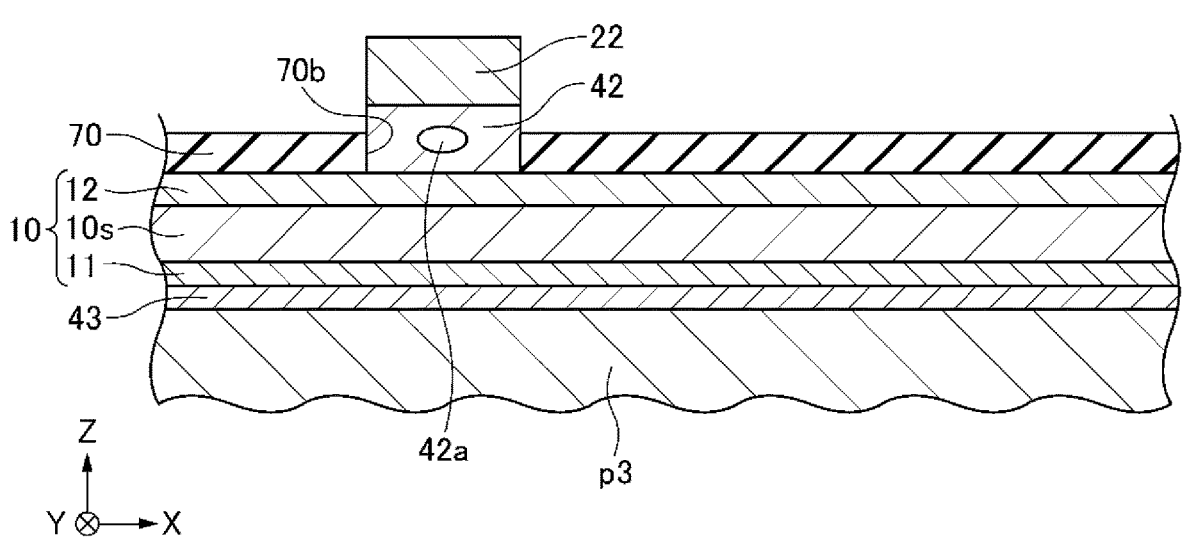

FIGS. 7A and 7B are schematic views of the semiconductor device 100 according to the present embodiment. FIGS. 7A and 7B are schematic cross-sectional views of main parts of the semiconductor device 100 according to the present embodiment.

FIG. 7A is a schematic cross-sectional view illustrating an aspect of joining the first portion p1 and the second electrode 12. FIG. 7A corresponds to an enlarged view of the schematic cross-sectional view taken along the line A1-A2 in FIG. 1C. The insulating film 70 is provided on the second electrode 12. The insulating film 70 contains, for example, a polyimide. However, a material contained in the insulating film 70 is not limited to a polyimide.

The insulating film 70 has an opening 70a. The first portion p1 and the second electrode 12 are connected to each other via the first connection member 41 provided in the opening 70a.

The first connection member 41 may have an air bubble (void) 41a. For example, when the first connection member 41 is a solder, the air bubble (void) 41a may be formed due to flux or the like contained in the solder.

FIG. 7B is a schematic cross-sectional view illustrating an aspect of joining the second conductive member 22 and the second electrode 12. FIG. 7B is an enlarged view of a schematic cross-sectional view taken along a line C1-C2 in FIG. 1C. The insulating film 70 has an opening 70b. The second conductive member 22 and the second electrode 12 are connected to each other via the conductive second connection member 42 provided in the opening 70b. Alternatively, the second conductive member 22 and the second electrode 12 may be in direct contact with each other without the second connection member 42.

The second connection member 42 may have an air bubble (void) 42a. For example, when the second connection member 42 is a solder, the air bubble (void) 42a may be formed due to flux or the like contained in the solder.

Figures 8, 9A:
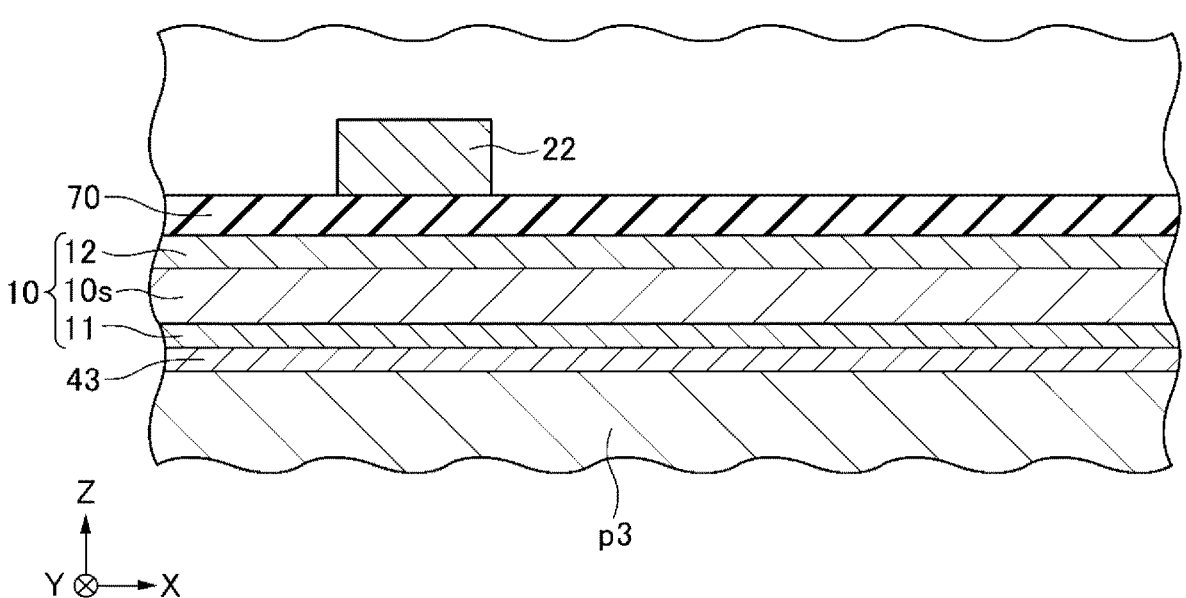
FIG. 8 is a schematic view of a semiconductor device according to another aspect of the first embodiment.
FIGS. 9A and 9B are schematic top views illustrating examples of an insulating film according to the first embodiment.

FIG. 8 is a schematic view of a semiconductor device 130 according to another aspect of the present embodiment. FIG. 8 is a schematic cross-sectional view of main parts of the semiconductor device 130 according to another aspect of the present embodiment. FIG. 8 corresponds to an enlarged view of the schematic cross-sectional view taken along the line C1-C2 in FIG. 1C.

As illustrated in FIG. 8, the insulating film 70 may not have the opening 70b. As illustrated in FIG. 8, the second conductive member 22 may be in direct contact with the insulating film 70.

Figure 9B:
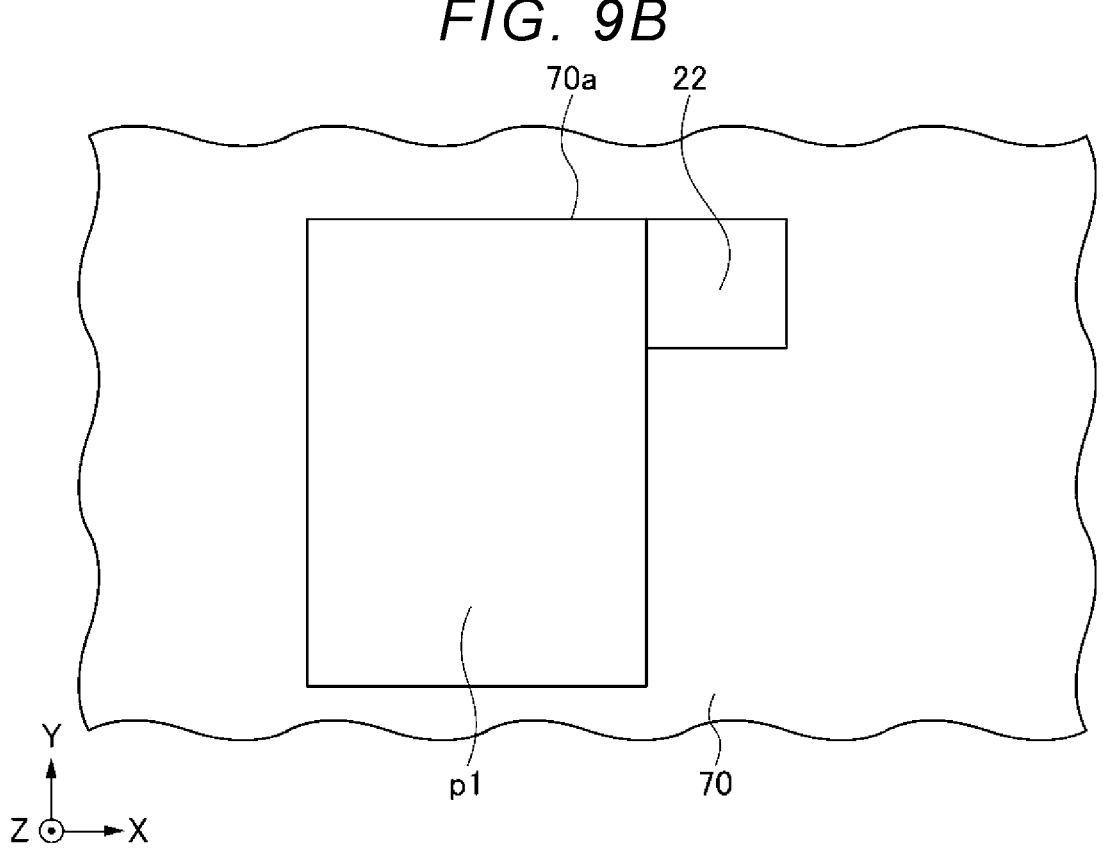

FIGS. 9A and 9B are schematic top views illustrating examples of the insulating film 70 according to the present embodiment.

As illustrated in FIG. 9A, the insulating film 70 includes, for example, the opening 70a and the opening 70b. In this case, as described with reference to FIGS. 7A and 7B, the first portion p1 and the second electrode 12 are connected to each other via the first connection member 41 provided in the opening 70a. Further, the second conductive member 22 and the second electrode 12 are connected to each other via the second connection member 42 provided in the opening 70b.

As illustrated in FIG. 9B, the insulating film 70 may have the opening 70a. In this case, both the first portion p1 and the second conductive member 22 are connected to the second electrode 12 via the first connection member 41 provided in the opening 70a.

For example, a metal such as copper (Cu) is used for the first conductive member 21, the second conductive member 22, the third conductive member 23, the fourth conductive member 24, the fifth conductive member 25, the sixth conductive member 26 and the seventh conductive member 27. For example, a solder or the like is used for the first connection member 41, the second connection member 42, the third connection member 43, the fourth connection member 44, the fifth connection member 45 and the sixth connection member 46. For example, an epoxy resin is provided for the resin 30. The resin 30 may contain, for example, a filler containing silicon oxide.

The semiconductor device according to the present embodiment is, for example, a small outline package (SOP) semiconductor device.

Next, operations and effects of the semiconductor device of the present embodiment will be described.

A request value of power for driving a semiconductor device as in the present embodiment increases year by year. Therefore, the method for dissipating the heat generated by the semiconductor chip 10 has become a problem. In particular, large heat generation occurs temporarily during a switching operation of the semiconductor device. Therefore, the method for dissipating such heat has become a problem.

In order to improve the heat dissipation described above, for example, it is conceivable to enlarge the first portion p1 of the first conductive member 21. This is to dissipate the heat generated by the semiconductor chip 10 to the outside of the semiconductor chip 10 via the first connection member 41 and the first portion p1. However, due to a stress of the semiconductor chip 10, a stress of the first connection member 41, and a stress of the first portion p1, the semiconductor chip 10, the first connection member 41 or the first portion p1 may be warped. In this case, the connection between the semiconductor chip 10 and the first portion p1 via the first connection member 41 may not be performed desirably.

Further, the power for driving a semiconductor device varies depending on a requested specification of the device. Depending on the specification, semiconductor chips 10 having different sizes are used. Here, even if the sizes of the semiconductor chips 10 are different, it is possible to more easily manufacture the semiconductor device as long as first conductive members 21 having a common size can be used.

In addition, for example, when a solder is used as the first connection member 41, an air bubble (void) may enter the solder. In a portion having such an air bubble, the thermal resistance is increased as compared with a portion of a peripheral connection member. Therefore, the heat dissipation of the semiconductor chip 10 becomes more difficult.

In addition, when the first portion p1 of the first conductive member 21 is enlarged, the size of the first connection member 41 also increases. This further increase a probability that the air bubble enters the inside of the solder used as the first connection member 41. Therefore, on the contrary, the heat generated by the semiconductor chip 10 is difficult to dissipate.

Therefore, the semiconductor device according to the present embodiment includes the second conductive member 22 provided in the second area 18 in a manner of being isolated from the first conductive member 21. When viewed from above, in the second area 18, with respect to the first area 17 of the active area 16 in which the first portion p1 is not provided, the circles sharing the centers of the shortest distances between the outer periphery of the first portion p1 and the outer periphery of the active area 16 can be drawn largest in the first area 17.

The second area 18 occupies a large area in the active area 16. Therefore, the second area is an area where the heat dissipation of the semiconductor chip 10 is particularly required. By placing the second conductive member 22 in the second area, the heat generated by the semiconductor chip 10 can be temporarily transferred to the second conductive member 22. Therefore, it is possible to more efficiently perform the heat dissipation of the semiconductor chip 10.

As illustrated in FIG. 8, the second conductive member 22 may be provided in an aspect of being in direct contact with the insulating film 70. However, for example, as illustrated in FIG. 7B, the second conductive member 22 is preferably connected to the second electrode 12 via the second connection member 42. It is considered that the second connection member 42 has a higher thermal conductivity than the insulating film 70. Therefore, the heat is easily transferred from the semiconductor chip 10 to the second conductive member 22.

Obviously, the second conductive member 22 may be connected to the second electrode 12 via the first connection member 41. This is because the heat is easily transferred from the semiconductor chip 10 to the second conductive member 22.

The second conductive member 22 has preferably, for example, a cylindrical shape. The heat generated by the semiconductor chip 10 spreads radially from a specific location in the semiconductor chip 10 in a plane parallel to the XY plane. In this way, the radially spread heat can be absorbed with a minimum size by the second conductive member 22 having a cylindrical shape.

Further, the second conductive member 22 has preferably, for example, a rectangular parallelepiped shape. When the second conductive member 22 has a rectangular parallelepiped shape, a large contact area with the active area 16 can be obtained. For this reason, a large amount of the generated heat can be transferred to the second conductive member 22.

According to the semiconductor device of the present embodiment, a semiconductor device having a wide safe operation area and high reliability can be provided.

Second Embodiment

Figure 10:
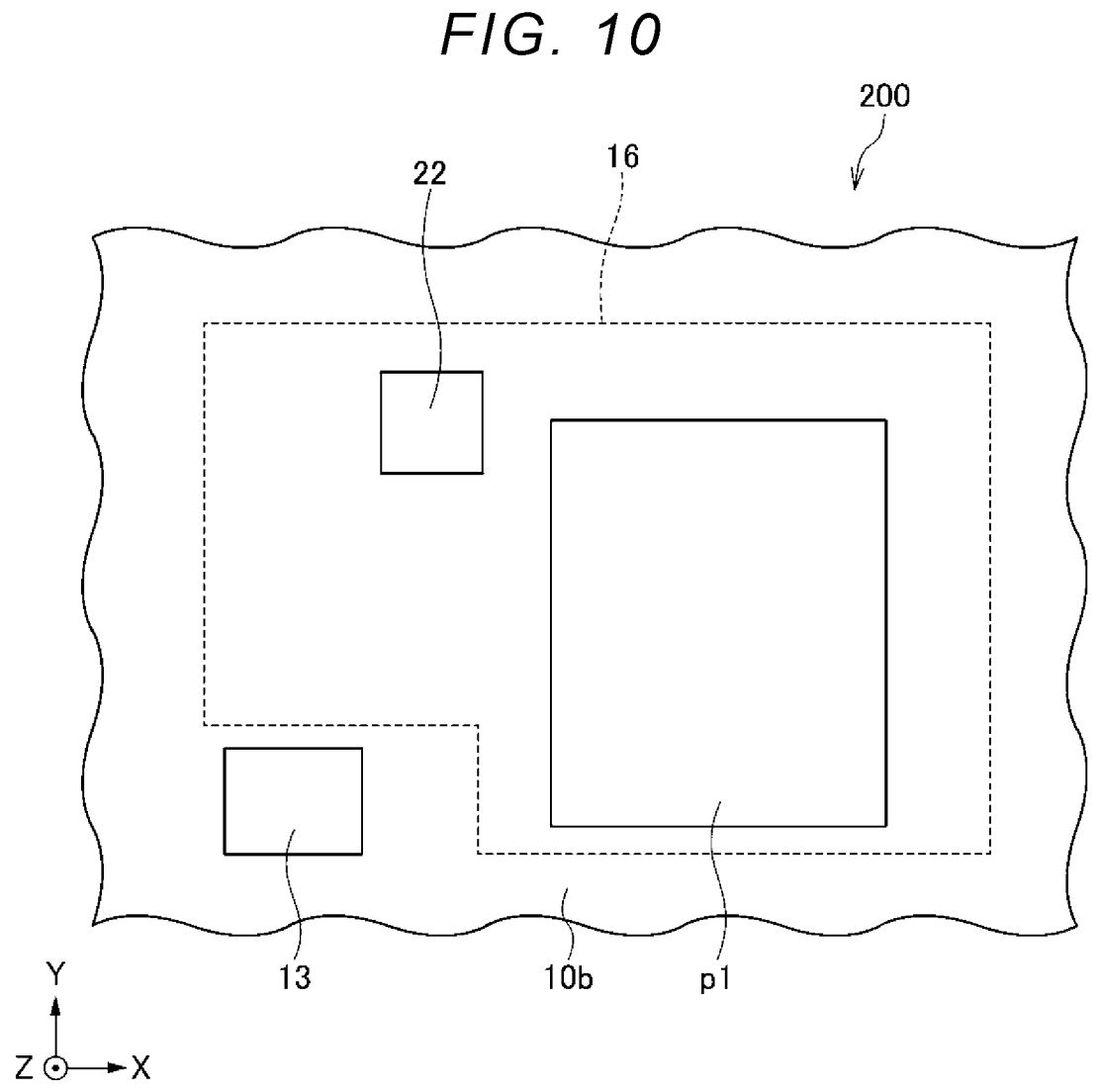

FIG. 10 is a schematic view of a semiconductor device 200 according to the present embodiment. FIG. 10 is a schematic view illustrating the placement of the active area 16, the first portion p1, the third electrode 13, and the second conductive member 22 when the second surface 10b of the semiconductor device 200 according to the present embodiment is viewed from above. Here, the description of the same content as those of the first embodiment is omitted.

In the semiconductor device 100 illustrated in FIGS. 4A and 4B, the third electrode 13 is provided on a lower right side of FIGS. 4A and 4B. Meanwhile, in the semiconductor device 200 according to the present embodiment illustrated in FIG. 10, the third electrode 13 is provided on a lower left side of FIG. 10.

More specifically, in the semiconductor device 200 according to the present embodiment, the placement of the third electrode 13, the shape of the active area 16, the placement of the first portion p1 and the placement of the second conductive member 22 are plane-symmetric with respect to a plane parallel to a YZ plane as compared with the semiconductor device 100.

According to the semiconductor device 200 of the present embodiment, a semiconductor device having a wide safe operation area and high reliability can also be provided.

Third Embodiment

A semiconductor device according to the present embodiment is different from the semiconductor devices according to the first embodiment and the second embodiment by further including a third conductive member provided in the second area in a manner of being isolated from the first conductive member and the second conductive member. When viewed from above, the first conductive member is provided between the second conductive member and the third electrode and between the third conductive member and the third electrode. The second conductive member and the third conductive member are provided symmetrically with respect to a plane passing through the third electrode and perpendicular to the first surface. The plane that passes through the third electrode and is perpendicular to the first surface can be an artificially defined virtual plane. Here, the description of the same content as the semiconductor devices according to the first embodiment and the second embodiment is omitted.

Figure 11:
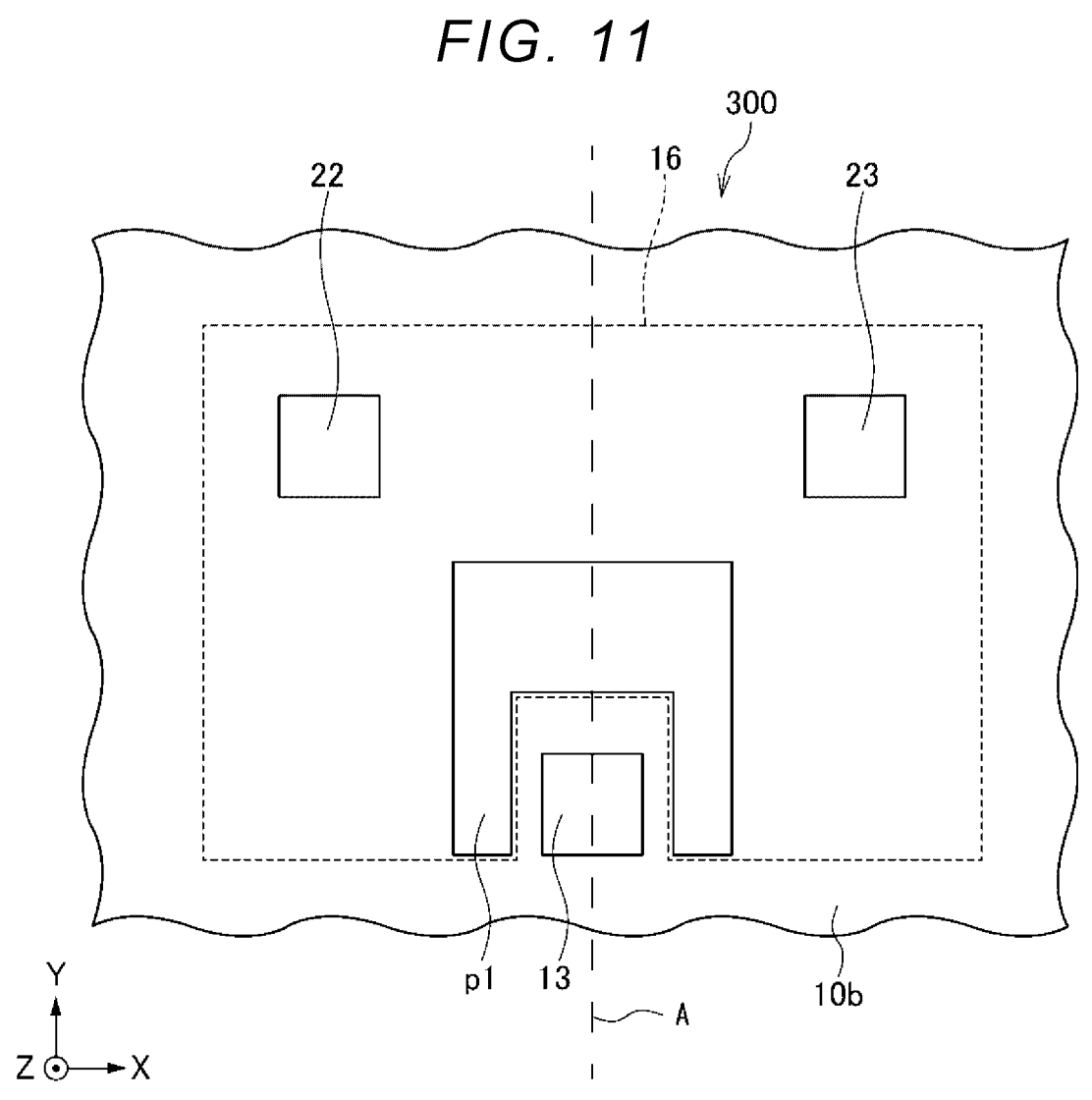

FIG. 11 is a schematic view of a semiconductor device 300 according to the present embodiment. FIG. 11 is a schematic view illustrating the placement of the active area 16, the first portion p1, the third electrode 13, the second conductive member 22 and the third conductive member 23 when the second surface 10b of the semiconductor device 300 according to the present embodiment is viewed from above.

When viewed from above, the active area 16 has a U-shape or a squared U-shape. When viewed from above, the third electrode 13 is provided inside the U-shape or the squared U-shape of the active area 16. The second conductive member 22 and the third conductive member 23 are provided outside the U-shape or the squared U-shape of the active area 16.

Further, when viewed from above, the first portion p1 has a U-shape or a squared U-shape. The third electrode 13 is provided inside the U-shape or the squared U-shape of the first portion p1. The second conductive member 22 and the third conductive member 23 are provided outside the U-shape or the squared U-shape of the first portion p1. When viewed from above, the first portion p1 is provided between the second conductive member 22 and the third electrode 13, and between the third conductive member 23 and the third electrode 13.

In order to unify operations of the active area 16, it is conceivable to design the third electrode 13 to be provided in the vicinity of a center of the active area 16. Therefore, in the semiconductor device 300, the active area 16 and the first portion p1 have a U-shape or a squared U-shape. The third electrode 13 is provided inside the U-shape or the squared U-shape.

Further, the second conductive member 22 and the third conductive member 23 are provided in the semiconductor device 300. This is because there may be a plurality of locations where large heat generation occurs.

Further, it is preferable that the second conductive member 22 and the third conductive member 23 are provided symmetrically with respect to a plane A passing through the third electrode 13 and perpendicular to the first surface 10a. This is because the above locations where large heat generation occurs are highly likely to occur symmetrically with respect to the plane A passing through the third electrode 13 and perpendicular to the first surface 10a.

According to the semiconductor device of the present embodiment, a semiconductor device having high reliability can also be provided.

Fourth Embodiment

Figure 12:
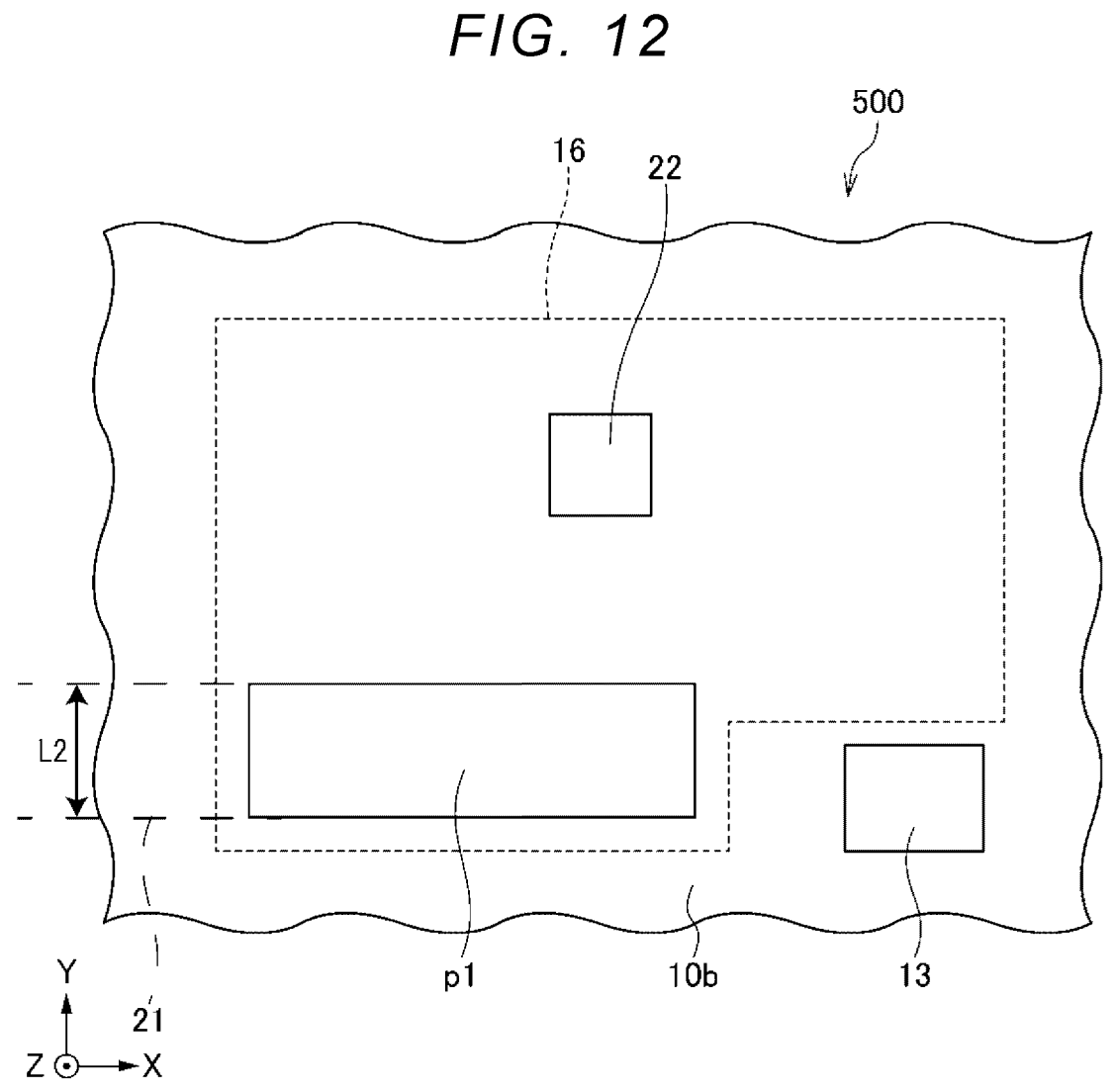

FIG. 12 is a schematic view of a semiconductor device 500 according to the present embodiment. FIG. 12 is a schematic view illustrating the placement of the active area 16, the first portion p1, the third electrode 13, and the second conductive member 22 when the second surface 10b of the semiconductor device 500 according to the present embodiment is viewed from above. Here, the description of the same content as those of the first embodiment to the third embodiment is omitted.

Here, a case where the first conductive member 21 extends along the X-axis direction is considered. The first conductive member 21 is manufactured by, for example, cutting out a single copper plate. At this time, for example, it is considered that a length L2 of the first conductive member 21 in the Y-axis direction is ½ of a length of the first conductive member 21 as a comparative example. In this case, the same first conductive member 21 can be applied to both a semiconductor device using the small semiconductor chip 10 and a semiconductor device using the large semiconductor chip 10. That is, common use of the first conductive member 21 can be achieved. Therefore, a preparation process of the first conductive member 21 is simplified, and thus it is easy to manufacture plural types of semiconductor devices. Therefore, it is possible to reduce cost for manufacturing plural types of semiconductor devices.

According to the semiconductor device of the present embodiment, a semiconductor device having high reliability can also be provided.

Fifth Embodiment

The semiconductor device according to the present embodiment is different from the semiconductor devices according to the first embodiment to the fourth embodiment in that, when viewed from above, a portion of the first conductive member 21 connected to the first connection member 41 and the second conductive member 22 extend in the same direction. Here, the description of the same content as those of the first embodiment to the fourth embodiment is omitted.

Figure 13:
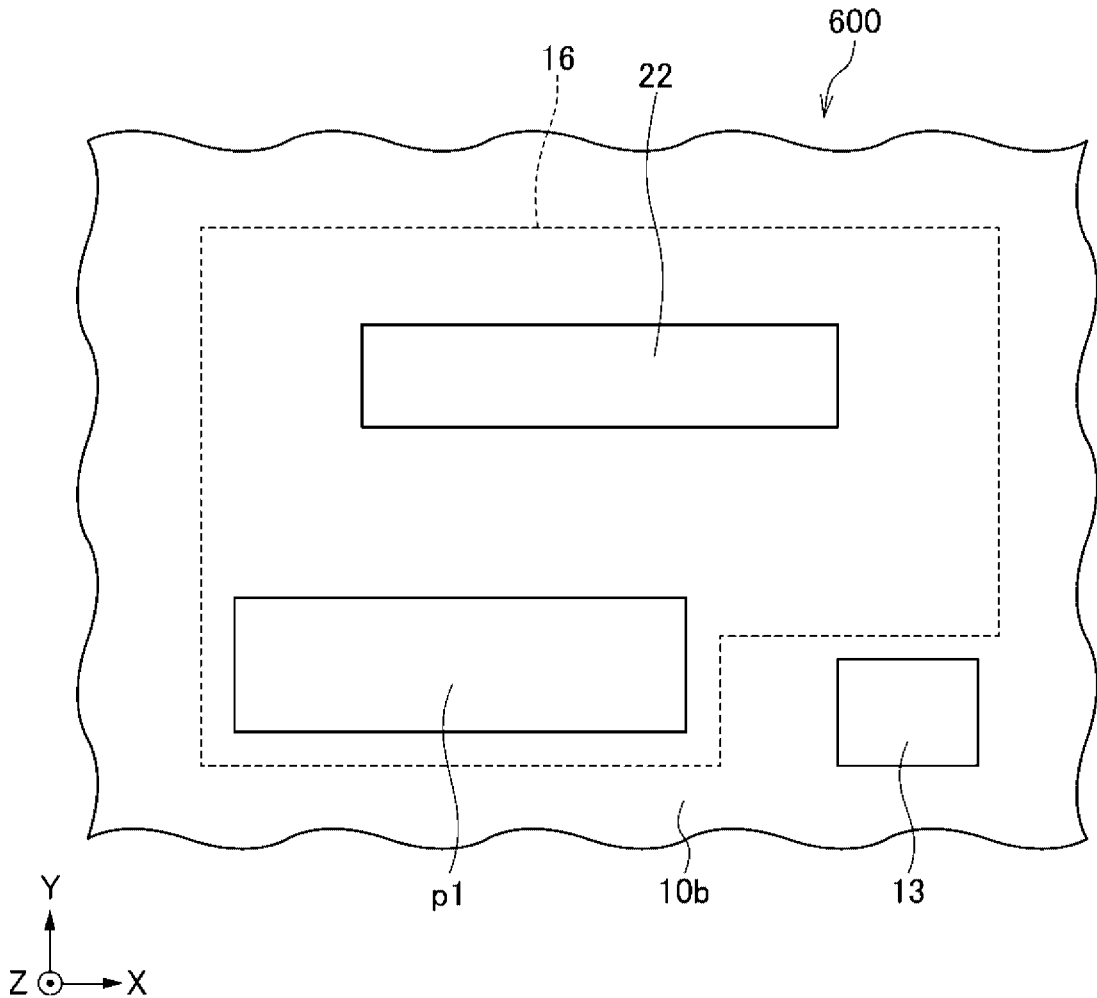
FIG. 13 is a schematic view of a semiconductor device according to a fifth embodiment.

FIG. 13 is a schematic view of a semiconductor device 600 according to the present embodiment. FIG. 13 is a schematic view illustrating the placement of the active area 16, the first portion p1, the third electrode 13, and the second conductive member 22 when the second surface 10*b* of the semiconductor device 600 according to the present embodiment is viewed from above. Here, the description of the same content as those of the first embodiment to the fourth embodiment is omitted.

When viewed from above, the first portion p1 and the second conductive member 22 both extend in the X-axis direction. Further, when viewed from above, the first portion p1 and the second conductive member 22 may both extend in the Y direction. This is to obtain an efficient reduction effect in the heat generation of the semiconductor device.

According to the semiconductor device of the present embodiment, a semiconductor device having high reliability can also be provided.

While certain embodiments and examples have been described, these embodiments and examples have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a semiconductor chip comprising:
      a first surface,
      a second surface different from the first surface, the second surface comprising an active area comprising a first area and a second area in the first area,
      a first electrode provided on the first surface,
      a second electrode provided on the second surface, and
      a third electrode provided on the second surface;
   a first conductor provided in the active area of the semiconductor chip and electrically connected to the semiconductor chip;
   a second conductor provided in the second area and isolated from the first conductor, when viewed from above, the second area being an area in which the first conductor is not provided, the second area being a portion of the first area having an area for circles with larger diameters between an outer periphery of the first conductor and an outer periphery of the active area compared to circles drawn in the first area between the outer periphery of the first conductor and the outer periphery of the active area;

a lead terminal connected to the first conductor;
   an insulating film provided above the second electrode and having a first opening; and
   a first connector provided in the first opening and connecting the first conductor and the semiconductor chip,
   wherein the insulating film further has a second opening, and
   the second conductor is connected to the second electrode via a second connector in the second opening.

2. The semiconductor device according to claim 1, wherein the second conductor is connected to the first connector.

3. The semiconductor device according to claim 1, wherein the first connector has a void.

4. A semiconductor device comprising:
   a semiconductor chip comprising:
      a first surface,
      a second surface different from the first surface, the second surface comprising an active area comprising a first area and a second area in the first area,
      a first electrode provided on the first surface,
      a second electrode provided on the second surface, and
      a third electrode provided on the second surface;
   a first conductor provided in the active area of the semiconductor chip and electrically connected to the semiconductor chip;
   a second conductor provided in the second area and isolated from the first conductor, when viewed from above, the second area being an area in which the first conductor is not provided, the second area being a portion of the first area having an area for circles with larger diameters between an outer periphery of the first conductor and an outer periphery of the active area compared to circles drawn in the first area between the outer periphery of the first conductor and the outer periphery of the active area;
   a lead terminal connected to the first conductor; and
   a third conductor provided in the second area in a manner of being isolated from the first conductor and the second conductor, wherein
      when viewed from above, the first conductor is provided between the second conductor and the third electrode and between the third conductor and the third electrode, and
      the second conductor and the third conductor are provided symmetrically with respect to a third plane passing through the third electrode and perpendicular to the first surface.

5. The semiconductor device according to claim 4, wherein
   when viewed from above, the active area has a U-shape or a squared U-shape, and
   when viewed from above, the third electrode is provided inside the U-shape or the squared U-shape of the active area.

6. The semiconductor device according to claim 4, wherein
   when viewed from above, the first conductor has a U-shape or a squared U-shape,
   the second conductor and the third conductor are provided outside the U-shape or the squared U-shape of the first conductor, and
   the third electrode is provided inside the U-shape or the squared U-shape of the first conductor.

* * * * *